United States Patent [19]
Vu

[11] Patent Number: 4,728,819
[45] Date of Patent: Mar. 1, 1988

[54] SWITCHING NETWORK

[75] Inventor: Tho T. Vu, Anoka, Minn.
[73] Assignee: Honeywell Inc., Minneapolis, Minn.
[21] Appl. No.: 900,958
[22] Filed: Aug. 27, 1986
[51] Int. Cl.[4] .................... H03K 17/687; G11C 27/02
[52] U.S. Cl. .................................... 307/353; 307/571; 307/584; 307/257
[58] Field of Search ............... 307/352, 353, 257, 321, 307/584, 571

[56] References Cited

U.S. PATENT DOCUMENTS 3,721,829  3/1973  Benson ................................. 307/352
4,540,902  9/1985  Ishikawa ............................. 307/352

OTHER PUBLICATIONS

P. H. Saul, "A GaAs MESFET Sample and Hold Switch" IEEE Journal of Solid-State Circuits, vol. SC-15 No. 3, Jun. 1980, pp. 282-285.

Primary Examiner—John Zazworsky
Attorney, Agent, or Firm—George A. Leone, Sr.; John G. Shudy, Jr.

[57] ABSTRACT

A switching network for a GaAs semiconductor circuit employing four FETs. The FETs are configured in a ring pattern which is connected to two matched current sources. Also disclosed is a sample-and-hold circuit employing such a switching network.

17 Claims, 7 Drawing Figures

SWITCHING NETWORK

BACKGROUND OF THE INVENTION

1. Field of the Invention

The present invention relates to switching networks and, more particularly, to gallium arsenide (GaAs) sample-and-hold switches employing FETs where such switches perform both analog and digital functions.

2. Description of the Prior Art

FIG. 1 shows a diode ring 10 which is typically used in various applications in GaAs semiconductor large scale integrated (LSI) circuits. In comparison to the present invention, the diode ring 10 typically has a narrower range of operating temperature, less voltage uniformity, and less desirable isolation properties. A network of the type shown in FIG. 1 is often used as a switch in a sample-and-hold circuit.

U.S. Pat. No. 3,302,039 to Baker discloses another ring type circuit utilizing bipolar devices. Baker's design uses three-terminal devices for the legs of the circuit, thereby necessitating the application of bias voltage to the transistor collectors in order to enable the circuit to operate. By employing FETs, the present invention avoids the necessity of such external voltage biasing.

SUMMARY OF THE INVENTION

A switching network is disclosed comprising an input means, an output means, first and second current generating means, control means, and four FETs. A first FET has its drain electrically connected to its gate and its source electrically connected to the input means. A second FET has its drain electrically connected to its gate and its source electrically connected to the output means. A third FET has its drain electrically connected to its gate, the source of the second FET and the output means. A fourth FET has its drain electrically connected to its gate, the input means and the source of the first FET, and its source electrically connected to the source of the third FET.

The first current generating means has first and second terminals wherein the first terminal of the first current generating means is grounded and its second terminal is electrically coupled to the drains of the first and second FETs. The second current generating means has first and second terminals wherein the first terminal of the second current generating means is grounded and its second terminal is electrically connected between the sources of the third and fourth FETs. Digital switch control means is electrically connected to the four FETs for gating the four FETs.

One advantage of the present invention as compared to a diode ring circuit is that the present invention has less charge transfer error than a diode ring.

Another advantage of the present invention is that temperature compensation is provided between the FET circuitry of the switching network and the input and output buffered amplifiers. As a result, the present invention will work more reliably in a wider range of temperatures than a diode ring.

Yet another advantage of the present invention is that the FET switching network can be designed for any amplitude of input signal and is better isolated from other elements in a sample-and-hold circuit than is the case when a diode ring is employed.

These and other objects, features and advantages of the invention will become apparent from the drawings and description of the invention below.

DETAILED DESCRIPTION OF THE PREFERRED EMBODIMENT

Figure 2:
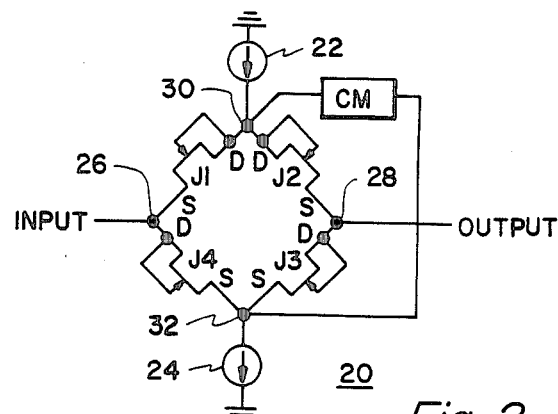
FIG. 2 illustrates one embodiment of the GaAs FET ring switching network of the invention.

FIG. 2 shows one embodiment of the GaAs FET ring switching network of the invention. In the embodiment shown in FIG. 2, the switching network comprises four FETs J1, J2, J3, and J4, an input, an output, two matched current sources 22 and 24 and control means, CM. While FIG. 2 shows the symbol for junction field effect transistors (JFETs), FETs employed in the circuit may be metal oxide semiconductor field effect transistors (MOSFETs), metal insulator semiconductor field effect transistors (MISFETs), metal semiconductor field effect transistors (MESFETs) or equivalent devices. It will be appreciated by one skilled in the art that the FETs may be enhancement or depletion mode FETs. FETs used may also be n-channel or p-channel devices. Furthermore, any semiconductor materials, such as silicon or indium phosphide, as well as gallium arsenide, may be used.

In the embodiment of the invention shown in FIG. 2, the input of the switching network is electrically connected at node 26 to the source of FET J1 and the drain of FET J4. The drain of FET J1 is electrically connected to the gate of J1, node 30 and the drain of FET J2. The drain of FET J2 is also electrically connected to the gate of FET J2. At node 28, the output of the switching network is electrically connected to the source of FET J2 and the drain of FET J3. The drain of FET J3 is also electrically connected to the gate of FET J3 and the source of FET J3 is electrically connected to node 32 as is the source of FET J4. A first terminal of current generating means 22 is electrically connected to node 30 and a second terminal is connected to ground. Current generating means 24 has a first terminal connected to ground and a second terminal connected to node 32. The drain and gate of FET J4 are electrically connected.

Figure 3:
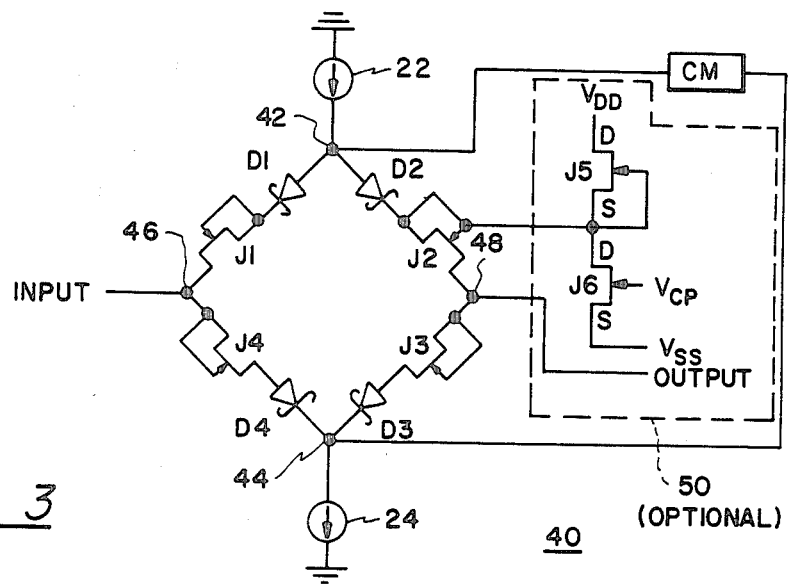
FIGS. 3 and 3A illustrate another embodiment of the FET ring switching network of the invention used in conjunction with diodes.
Figure 3A:
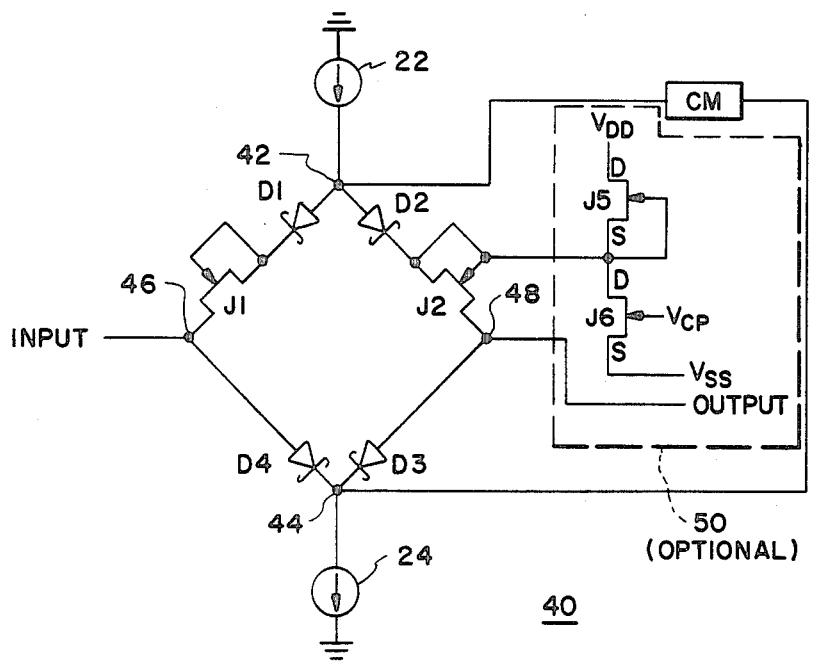

Referring now to FIG. 3, another embodiment of the invention is shown as may be employed in a sample-and-hold circuit. In FIG. 3 it can be seen that the four FETs can be used in conjunction with diodes D1, D2, D3, and D4. The top two legs of the ring circuit have diodes D1 and D2 with their anodes electrically connected together to a second terminal of current source 22. The cathode of diode D1 is electrically connected to the drain of FET J1. The cathode of diode D2 is electrically connected to the drain of FET J2. The drains of FETs J1, J2, J3, and J4 are all electrically connected to their respective gates. The input is electrically connected at node 46 to the source of J1 and the drain of J4. The output is electrically connected at node 48 to the source of J2 and the drain of J3. Finally, the sources of FETs J4 and J3 are electrically connected to the anodes of diodes D4 and D3 respectively. The cathodes of diodes D4 and D3 are electrically connected to a second terminal of current source 24 at node 44. Optionally, FETs J3 and J4 may be removed from the circuit and the anodes of diodes D4 and D3 may be electrically connected to the input and output respectively. This option is shown in FIG. 3A.

In yet another optional configuration of the circuit shown in FIG. 3, FETs J5 and J6 are used to clamp the gate of J2 to the output in the hold mode of the circuit. The drain of J5 is electrically connected to an external voltage $V_{DD}$, the source of FET J5 is electrically connected to the gate of FET J5, the drain of FET J6 and the gate of FET J2.

Figure 1:
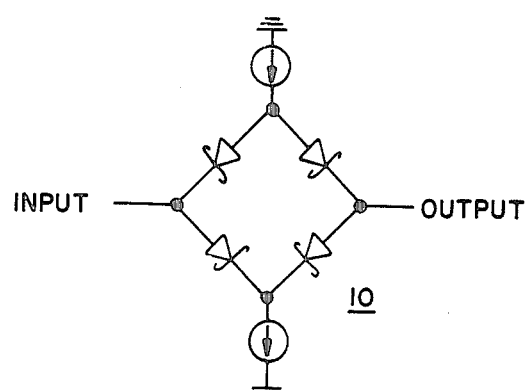
FIG. 1 illustrates a diode ring switching network.

Note while that in FIGS. 1, 2, and 3, a first terminal of each of the current generating means 22 and 24 is shown to be electrically connected to ground, it is not necessary that the current generating means be grounded. It is possible for the switching network to float above ground and it has many uses in such a configuration. This will be illustrated further in the discussion below.

Figure 4:
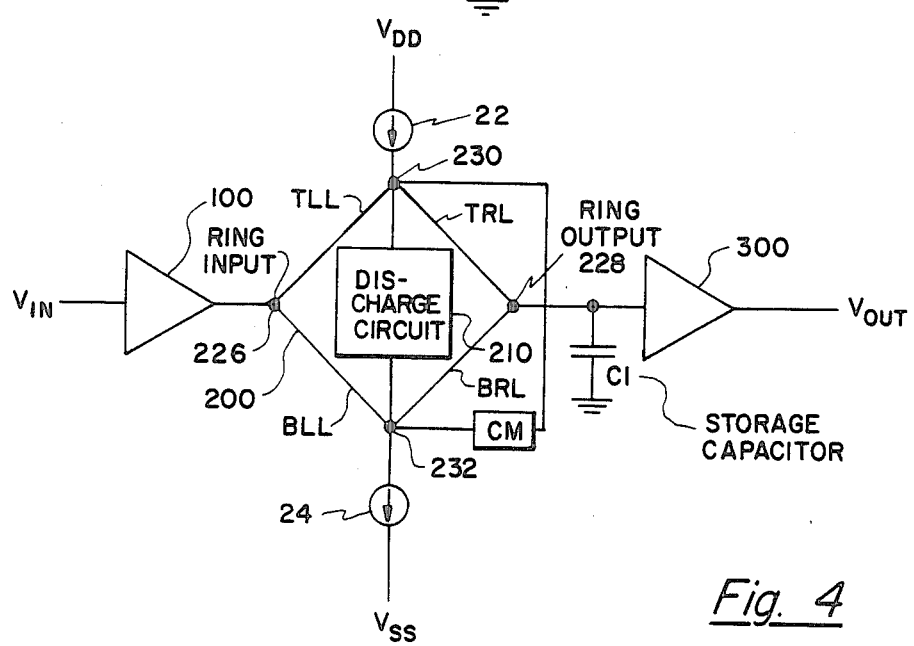
FIG. 4 illustrates a block diagram sample-and-hold circuit employing one embodiment of the FET ring switching network of the invention.

Referring now to FIG. 4, a block diagram of a sample-and-hold circuit employing the present invention is shown. The sample-and-hold circuit comprises of amplifiers 100 and 300, the switching network of the present invention 200, control means CM, bridge discharge means 210, current sources 22 and 24 and external voltage sources $V_{DD}$ and $V_{SS}$. Amplifier 100 is connected at its input to an electrical signal, $V_{IN}$, and at its output to the input of the switching ring 226. A first terminal of the current source 22 is connected to external voltage source $V_{DD}$ and a second terminal of current source 22 is connected to a first terminal of the control means CM at node 230. For ease of reference, the switching network 200 is described in terms of four legs, the Top Left-Hand Leg (TLL), the Top Right-Hand Leg (TRL), the Bottom Left-Hand Leg (BLL), and the Bottom Right-Hand Leg (BRL). Also connected at node 230 are the first terminal of TLL and the first terminal of TRL. The second terminal of TLL and the first terminal of BLL are electrically connected at node 226. The second terminal of BLL and the second terminal of BRL are electrically connected at node 232 to a second terminal of control means CM and a first terminal of current source 24. The first terminal of BRL and the second terminal of TRL are electrically connected at ring output 228 to a first terminal of means for storing an electrical signal C1 and the input terminal of amplifier 300. C1 may most advantageously be a storage capacitor, the value of which depends upon the type of signals to be stored, power dissipation and other factors inherent in the overall design of the circuit. A second terminal of storage means C1 is electrically connected to ground. A second terminal of current source 24 is electrically connected to an external voltage source $V_{SS}$ at a lower potential than node 232. A discharge circuit 210 is connected between nodes 230 and 232 in the switching ring network 200. For purposes of simplification, the components which comprise the four legs of the ring network TLL, BLL, TRL, and BRL are not shown in FIG. 4, but will be understood to comprise the FET structure of FIG. 2, the FET and diode circuit of FIG. 3 or equivalent circuits.

The sample-and-hold circuit of FIG. 4 functions as follows. An input signal $V_{IN}$ is applied to one input of the amplifier 100. The amplified signal is then output from amplifier 100 and applied to the ring input at 226. Control means CM digitally controls the ring network 200 to either sample the new signal and store it in storage means C1 or isolate the amplified input signal from the input of the amplifier 300 and storage means C1, thereby retaining or holding whatever value is presently stored by means C1. Amplifier 300 outputs an amplified signal of the value which is stored in storage means C1.

Figure 5:
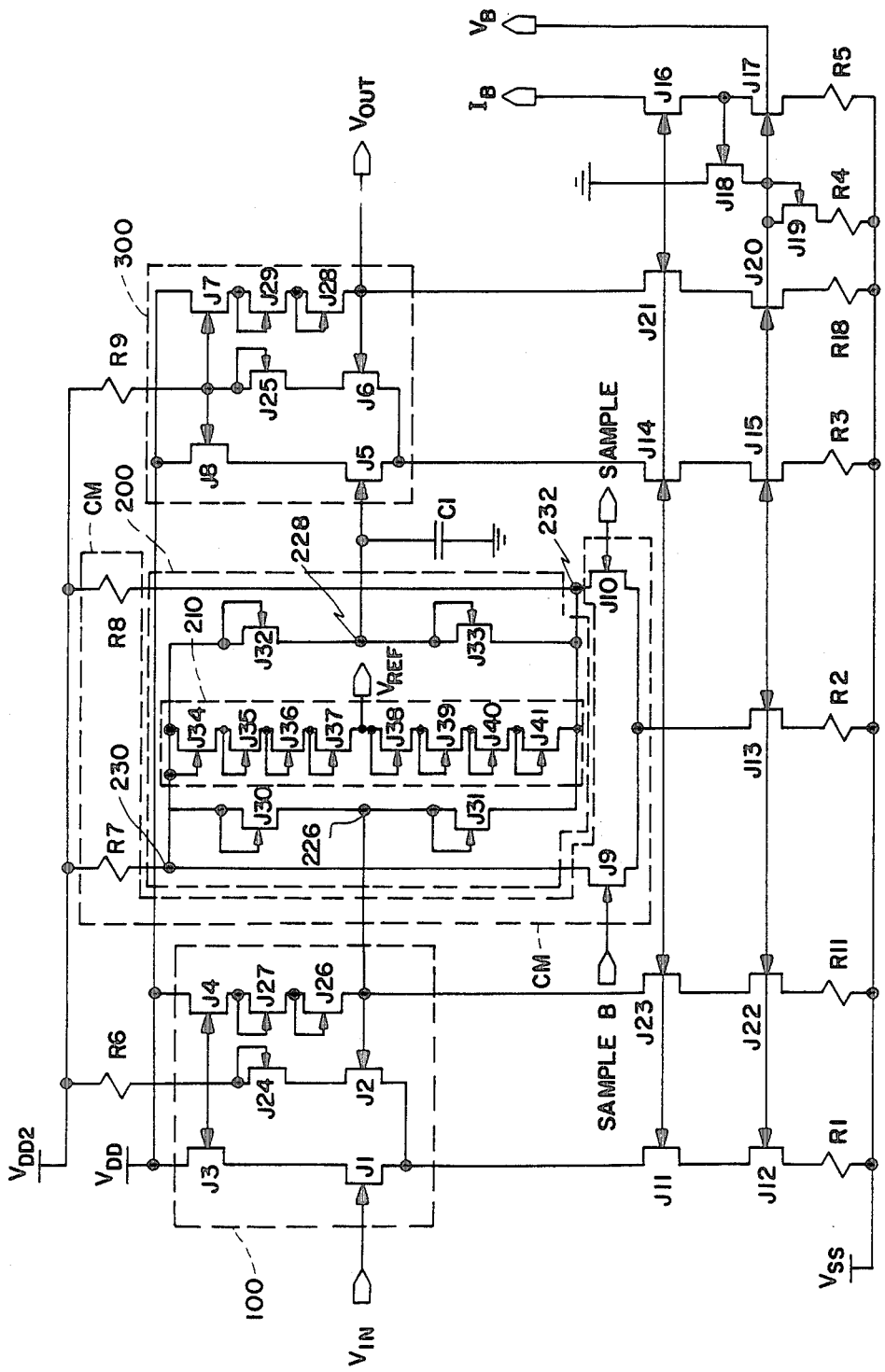
FIG. 5 shows a more detailed schematic of one embodiment of a sample-and-hold circuit employing the switching network of the present invention.

Referring now to FIG. 5, a more detailed circuit schematic of one embodiment of the sample-and-hold circuit shown in the block diagram of FIG. 4 is illustrated. The components comprising amplifier 100 are indicated in FIG. 5 by the dotted line box 100. An input signal $V_{IN}$ is applied to the gate of FET J1. The source of FET J1 is electrically connected to the source of FET J2. The drain of FET J1 is electrically connected to the source of FET J3. The drain of FET J3 is electrically connected to a positive polarity external voltage source $V_{DD}$. The gate of FET J3 is electrically connected to the gate of FET J4, the drain of FET J24 and a first terminal of resistor R6. The drain of FET J4 is electrically connected to $V_{DD}$. The drain of FET J24 is electrically connected to its gate, and the source of FET J24 is electrically connected to the drain of FET J2. The source of FET J4 is electrically connected to the drain of FET J27 which is also electrically connected to its gate. The source of FET J27 is electrically connected to the drain of FET J26 which is, in turn, electrically connected to its gate. The source of FET J26 is electrically connected to the gate of J2, the drain of J23 and the input node of the switching ring at 226.

A second positive polarity external voltage source of a larger positive value than $V_{DD}$ is $V_{DD2}$ which is electrically connected to a first terminal of resistors R6, R7, R8, and R9. In one example of the invention shown in FIG. 5 as designed by Honeywell Inc., $V_{DD}$ was set at about +1 volt, $V_{DD2}$ was set at about +15 volts and $V_{SS}$ was set at about −5 volts. Values for R6 through R9 range from about 20 Kohms to about 40 Kohms in the same example. A second terminal of resistor R7 is electrically connected to the switching network at node 230 and also connected to the drain of FET J9. A second terminal of resistor R8 is electrically connected to the switching network at node 232 and also electrically connected to FET J10. A second terminal of resistor R9 is electrically connected t the gates of FETs J8 and J7 and the drain of FET J25. The gate of FET J5 is electrically connected to the ring output 228 and first terminal of the storage capacitor C1. FETs J5, J6, J7, J8, J25, J28, and J29 are electrically connected in a configuration suitable to form amplifier 300. The gate of FET J6 is electrically connected to the source of FET J28 forming the output terminal of the circuit, $V_{OUT}$.

FETs J9 and J10 are employed as switches and, together with resistors R7 and R8, comprise the control means CM which determines whether or not the FET ring switching network will switch a signal from the ring input to the ring output for storage in capacitor C1. By applying appropriate complementary (high/low) digital signals to the gates of J10 and J9 (marked sample and sample B respectively) the ring switch is controlled. When sample is a logical high, the input signal is taken into (sampled by) the switching network. This is called the track function. When sample is low, the sampled signal is stored in the storage capacitor. This is termed the hold function.

FETs J34 through J41 comprise one embodiment of discharge circuit 210. The drain of FET J34 is electrically connected to node 230 and the source of FET J41 is electrically connected to node 232. FETs J34 through J37 have their respective drains electrically connected to their respective gates. The source of FET J34 is electrically connected to the drain of FET J35. The source of FET J35 is electrically connected to the drain of FET J36 and the source of FET J36 is electrically connected to the drain of FET J37. The source of FET J37 is electrically connected to a reference voltage $V_{REF}$. The drain of FET J38 is also electrically connected to $V_{REF}$. FETs J38 through J41 are electrically connected source to drain as described above for FETs J34 through J37. One skilled in the art will appreciate that a greater or lesser number of such FETs may advantageously be employed in the discharge circuit, depending upon the voltage drop across each such FET.

$V_{REF}$ is a reference voltage at the midpoint of the voltages present at nodes 230 and 232 as expressed in the following formula:

$$V_{REF} = \tfrac{1}{2}(V_{(230)} + V_{(232)}).$$

$V_{REF}$ is used as a reference point for setting the voltage swing of the switching network. In operation, the discharge circuit is used to discharge the switching network capacitance quickly. It also serves to help the network recover (i.e., charge) to a normal (i.e., stable) position quickly.

FETs J11 through J23 are electrically connected in a pattern suitable to form two matched current sources. The gates of FETs J11, J23, J14, J16, and J21 are electrically connected. The gates of FETs J12, J13, J15, J20, J22, and J17 are electrically connected to external voltage source $V_B$. The drain of FET J11 is electrically connected to the source of FET J1. The source of FET J11 is electrically connected to the drain of FET J12. The source of FET J12 is electrically connected to one terminal of resistor R1. A negative polarity power supply $V_{SS}$ is electrically connected to a first terminal of each of the following resistors: R1, R11, R2, R3, R18, R4, and R5 which, in one example of the invention, had values in the range of 500 ohms to 2000 ohms. The drain of FET J23 is electrically connected to node 226. The source of FET J23 is connected to the drain of FET J22. The source of FET J22 is electrically connected to a second terminal of resistor R11. The drain of FET J13 is electrically connected to the sources of FETs J9 and J10. The source of FET J13 is electrically connected to a second terminal of resistor R2. The drain of FET J14 is electrically connected to the sources of FETs J5 and J6. The source of FET J14 is electrically connected to the drain of FET J15. The source of FET J15 is electrically connected to a second terminal of resistor R3. The drain of FET J21 is electrically connected to $V_{OUT}$, and the source of FET J21 is electrically connected to the drain of FET J20. The source of FET J20 is electrically connected to a second terminal of resistor R18. The drain of FET J18 is electrically connected to ground, and the source of FET J18 is electrically connected to the gate of FET J19. The gate of FET J18 is electrically connected to the source of FET J16 and the drain of FET J17. The drain of FET J19 is electrically connected to voltage source $V_B$ and its own gate. The source of FET J19 is electrically connected to a second terminal of resistor R4. The source of FET J17 is electrically connected to a second terminal of resistor R5.

The legs switching ring network 200 are comprised of FETs J30 through J33 which are electrically connected in a pattern suitable to form a switching network as described above and illustrated in FIG. 2.

Figure 6:
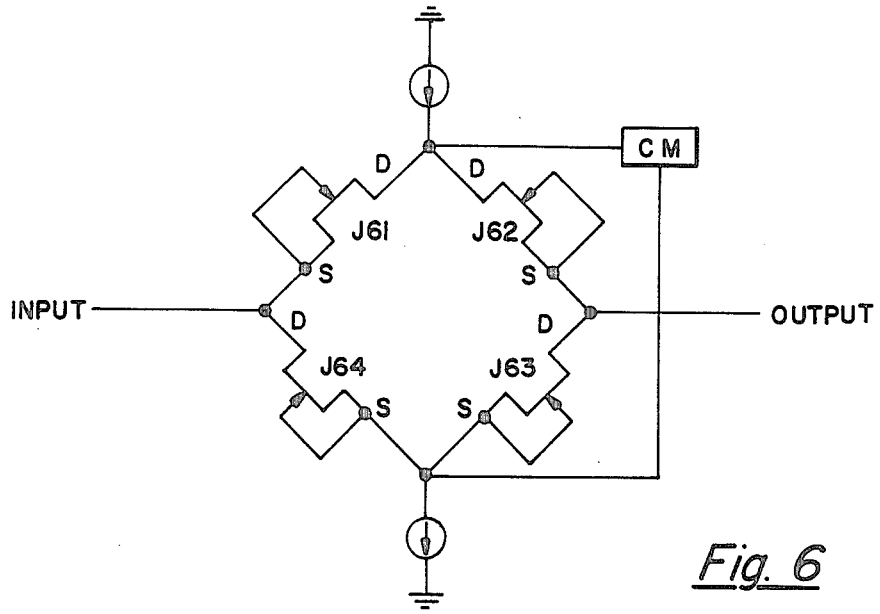
FIG. 6 illustrates another embodiment of the GaAs FET ring switching network of the invention wherein the FETs have their gates tied to their sources.

It is to be understood that the foregoing embodiments of the present invention are illustrative of the principle of this invention. In light of this teaching, it is apparent that numerous other arrangements may be devised by those skilled in the art without departing from the spirit and scope of the invention. For example, FIG. 6 illustrates another alternative embodiment of the present invention wherein the sources of each FET in the switching network are connected to their respective gates.

The embodiments of the invention in which an exclusive property or right is claimed are defined as follows:

1. A switching network comprising:
   an input means;
   an output means;
   a first FET having its drain electrically connected to its gate and its source electrically connected to the input means;
   a second FET having its drain electrically connected to its gate and the drain of the first FET, and its source electrically connected to the output means;
   a third FET having its drain electrically connected to its gate and further having its drain and gate electrically connected to the source of the second FET and the output means;
   a fourth FET having its drain electrically connected to its gate, and further having its drain and gate electrically connected to the input means and the source of the first FET, and having its source electrically connected to the source of the third FET;
   a first current generating means having first and second terminals wherein the first current generating means first terminal is grounded and its second terminal is electrically connected between the drains of the first and second FETs;
   a second current generating means having first and second terminals wherein the second current generating means first terminal is grounded and its second terminal is electrically connected between the sources of the third and fourth FETs; and
   switch control means for gating the four FETs of the switching network on and off.

2. The switching network of claim 1 wherein:
   a first diode is additionally electrically connected between the drain of the first FET and the second terminal of the first current generating means such that the cathode of the first diode is connected to the drain of the first FET and the anode of the first diode is connected to the second terminal of the first current generating means;
   a second diode is additionally electrically connected between the second terminal of the first current generating means and the second FET such that the anode of the second diode is connected to the second terminal of the first current generating means and the cathode is connected to the drain of the second FET;
   a third diode is additionally electrically connected between the third FET and the second terminal of the second current generating means such that the anode of the third diode is connected to the source of the third FET and the cathode of the third diode is connected to the second terminal of the second current generating means; and a fourth diode is additionally electrically connected between the fourth FET and the second terminal of the second current generating means such that the anode of the fourth diode is connected to the source of the fourth FET and the cathode of the fourth diode is connected to the second terminal of the second current generating means.

3. The switching network of claim 1 wherein the circuit components are comprised of material selected from the group consisting of gallium arsenide, silicon and indium phosphide.

4. The switching network of claim 1 wherein the FETs are depletion mode devices.

5. The switching network of claim 1 wherein the FETs are enhancement mode devices.

6. The switching network of claim 1 wherein the FETs are p-channel devices.

7. The switching network of claim 1 wherein the FETs are n-channel devices.

8. The switching network of claim 1 wherein the FETs are depletion mode devices.

9. The switching network of claim 1 wherein the FETs are enhancement mode devices.

10. The switching network of claim 1 wherein the FETs are p-channel devices.

11. The switching network of claim 1 wherein the FETs are n-channel devices.

12. A switching network comprising:
an input means;
an output means;
a first FET having its drain electrically connected to its gate and its source electrically connected to the input means;
a first diode having its cathode electrically connected to the drain of the first FET;
a second FET having its drain electrically connected to its gate and its source electrically connected to the output means;
a second diode having its cathode electrically connected to the drain of the second FET and its anode electrically connected to the anode of the first diode;
a third diode having its anode electrically connected to the output means;
a fourth diode having its anode electrically connected to the input means and it cathode electrically connected to the cathode of the third diode;
a first current generating means having first and second terminals wherein the first current generating means first terminal is grounded and its second terminal is electrically connected to the anodes of the first and second diodes;
a second current generating means having first and second terminals wherein the second current generating means first terminal is grounded and its second terminal is electrically connected to the cathodes of the third and fourth diodes; and
switch control means for gating the first and second FETs of the switching network on and off.

13. The switching network of claim 12 wherein the circuit components are comprised of material selected from the group consisting of gallium arsenide, silicon and indium phosphide.

14. A sample-and-hold circuit comprising:
a first amplifier having an input terminal and an output terminal;
a switching ring network having an input terminal and an output terminal and comprised of first, second, third, and fourth legs wherein each leg comprises an FET;
a first current generating means connected at a first terminal to an external voltage source and connected at a second terminal to the node between the first and second FETs;
a first means for amplifying an electrical signal having an input and an output, the output being electrically connected to the node between the first and fourth FETs;
a second means for amplifying an electrical signal having an input electrically connected to the node between the second and third FETs and having an output;
means for storing an electrical signal electrically connected to the input of the second amplifying means;
means for controlling the switching ring network having a first terminal connected to the node joining the first and second FETs and the second terminal of the first current generating means, and having a second terminal electrically connected to the node joining the third and fourth FETs and the second terminal of the second current generating means; and
means for discharging the switching ring network having a first terminal electrically connected to the node joining the first and second FETs and having a second terminal electrically connected to the node joining the third and fourth FETs.

15. The circuit of claim 14 wherein the circuit components are comprised of material selected from the group consisting of gallium arsenide, silicon and indium phosphide.

16. The circuit of claim 15 wherein the means for storing an electrical signal comprises a capacitor.

17. The circuit of claim 14 wherein the means for storing an electrical signal comprises a capacitor.

* * * * *